(12) United States Patent
Kim

(10) Patent No.: US 8,063,677 B2
(45) Date of Patent: Nov. 22, 2011

(54) PHASE LOCKED LOOP AND METHOD FOR OPERATING THE SAME

(75) Inventor: Kwan-Dong Kim, Gyeonggi-do (KR)

(73) Assignee: Hynix Semiconductor Inc., Gyeinggi-do (KR)

( * ) Notice: Subject to any disclaimer, the term of this patent is extended or adjusted under 35 U.S.C. 154(b) by 0 days.

(21) Appl. No.: 12/648,816

(22) Filed: Dec. 29, 2009

(65) Prior Publication Data

US 2011/0156779 A1 Jun. 30, 2011

(30) Foreign Application Priority Data

Dec. 28, 2009 (KR) ........................ 10-2009-0131949

(51) Int. Cl.
*H03L 7/06* (2006.01)

(52) U.S. Cl. ........................................ 327/156; 327/147
(58) Field of Classification Search .................. None
See application file for complete search history.

(56) References Cited

U.S. PATENT DOCUMENTS

| 6,359,950 | B2* | 3/2002 | Gossmann et al. | 375/376 |
| 6,614,319 | B2 | 9/2003 | Saeki et al. | |
| 6,967,536 | B2* | 11/2005 | Hayashida et al. | 331/1 A |
| 7,375,593 | B2* | 5/2008 | Self | 331/16 |
| 2003/0214332 | A1 | 11/2003 | Chen et al. | |
| 2008/0094116 | A1* | 4/2008 | Lee | 327/158 |
| 2008/0303568 | A1* | 12/2008 | Werner et al. | 327/158 |

FOREIGN PATENT DOCUMENTS

| KR | 100859834 | 9/2008 |
| KR | 1020080089092 | 10/2008 |
| KR | 1020080101445 | 11/2008 |

\* cited by examiner

*Primary Examiner* — Cassandra Cox
(74) *Attorney, Agent, or Firm* — IP & T Group LLP

(57) ABSTRACT

A phase locked loop includes a phase lock unit configured to compare a phase of a reference clock with a phase of a feedback clock and to generate an internal clock based on the comparison; a delay lock unit configured to compare the reference clock with the internal clock, and to generate the feedback clock which is delayed in response to a control voltage based on the comparison; and a start voltage enable unit configured to receive an enable signal and to apply a start voltage as the control voltage in response to the enable signal.

18 Claims, 4 Drawing Sheets

PHASE LOCKED LOOP AND METHOD FOR OPERATING THE SAME

CROSS-REFERENCE TO RELATED APPLICATIONS

The present application claims priority of Korean Patent Application No. 10-2009-0131949, filed on Dec. 28, 2009, which is incorporated herein by reference in its entirety.

BACKGROUND OF THE INVENTION

Exemplary embodiments of the present invention relate to a phase locked loop and method for operating the same, and more particularly, to a phase locked loop (PLL) which synchronize a reference clock with a feedback clock and method for operating the same.

Semiconductor devices such as double data rate (DDR) synchronous dynamic random access memory (SDRAM) receive an external clock as a reference to match operation timings.

However, since a clock skew may occur in the external clock due to the delay in clock/data path of internal circuits, an internal clock is desired to be synchronized with the external clock by inversely compensating for the internal clock so that the internal clock which is delayed through internal circuits is aligned to a center or an edge of the external clock.

In order to synchronize the internal clock with the external clock, a clock synchronization circuit is provided in the semiconductor device. Examples of the clock synchronization circuit include a phase locked loop (PLL) and a delay locked loop (DLL).

The PLL having a frequency multiplication function is mainly used when the frequency of the external clock is different from the frequency of the internal clock, and the DLL is mainly used when the frequency of the external clock is equal to the frequency of the internal clock.

The configuration of the PLL is basically similar to that of the DLL. The PLL uses a voltage controlled oscillator (VCO) to generate the internal clock while the DLL uses a voltage controlled delay line (VCDL).

In particular, the PLL is used in a variety of applications, e.g., communications, wireless systems, digital circuits, etc, generates various clocks through frequency synthesis and easily achieves a clock data recovery (CDR).

The PLL includes a phase frequency detector (PFD) for detecting a phase difference between a reference clock and a feedback clock and matches a phase of the reference clock with a phase of the feedback clock by driving a charge pump in accordance with the detected phase difference of the PFD and varying a control voltage of a voltage controlled oscillator.

However, even if the phase of the reference clock is matched with the phase of the feedback clock, because the PLL has a charge pump having less than ideal characteristics, a phase offset having a direct current (DC) component still occurs between the reference clock and the feedback clock, for example, by a mismatching of an up current and a down current in the charge pump.

While the phase of the reference clock is desired to be matched with the phase of an output clock (feedback clock) outputted from the PLL when the PLL is turned on, a phase offset still exists between the reference clock and the feedback clock, and thus, the efficiency of the PLL decreases.

Moreover, since a control voltage level of a voltage controlled oscillator included in the PLL is varied according to a change of a process/voltage/temperature (PVT) and an input frequency, a current driving power of a transistor is varied according to a change of the PVT, and the phase offset having a DC component may be varied according to an operating condition of the PLL.

SUMMARY OF THE INVENTION

An embodiment of the present invention is directed to a phase locked loop for removing a phase offset between a reference clock and a feedback clock.

Another embodiment of the present invention is directed to a phase locked loop for minimizing a mismatching between an up-current and a down-current.

In accordance with an embodiment of the present invention, a phase locked loop includes a phase lock unit configured to compare a phase of a reference clock with a phase of a feedback clock and to generate an internal clock based on the comparison; a delay lock unit configured to compare the reference clock with the internal clock, and to generate the feedback clock which is delayed in response to a control voltage based on the comparison of the reference clock with the internal clock; and a start voltage enable unit configured to receive an enable signal and to apply a start voltage as the control voltage in response to the enable signal.

In accordance with another embodiment of the present invention, a phase locked loop includes a phase lock unit configured to compare a phase of a reference clock and a phase of a feedback clock and to generate an internal clock based on the comparison; and a delay lock unit configured to compare a phase of the internal clock outputted from the phase lock unit with the phase of the reference clock and to generate the feedback clock by delaying the internal clock by a certain delay amount.

In accordance with another embodiment of the present invention, a method for operating a phase locked loop includes applying a start voltage to a delay lock unit if an enable signal is received; providing a first enable signal for enabling a phase lock unit to the phase lock unit if the enable signal is terminated; comparing a phase of a reference clock with a phase of a feedback clock and generating an internal clock based on the comparison; and comparing the phase of the reference clock with the phase of the internal clock and generating the feedback clock based on the comparison of the phase of the reference clock with the phase of the internal clock.

In accordance with another embodiment of the present invention, a method for operating a phase locked loop includes performing a first locking operation by comparing a phase of a reference clock and a phase of a feedback clock and generating an internal clock, which is synchronized with the reference clock, based on the comparison; and performing a second locking operation by comparing the phase of the reference clock and the phase of the internal clock, delaying the internal clock by a certain delay amount, and generating the feedback clock by delaying the internal clock.

DESCRIPTION OF SPECIFIC EMBODIMENTS

Figure 1:
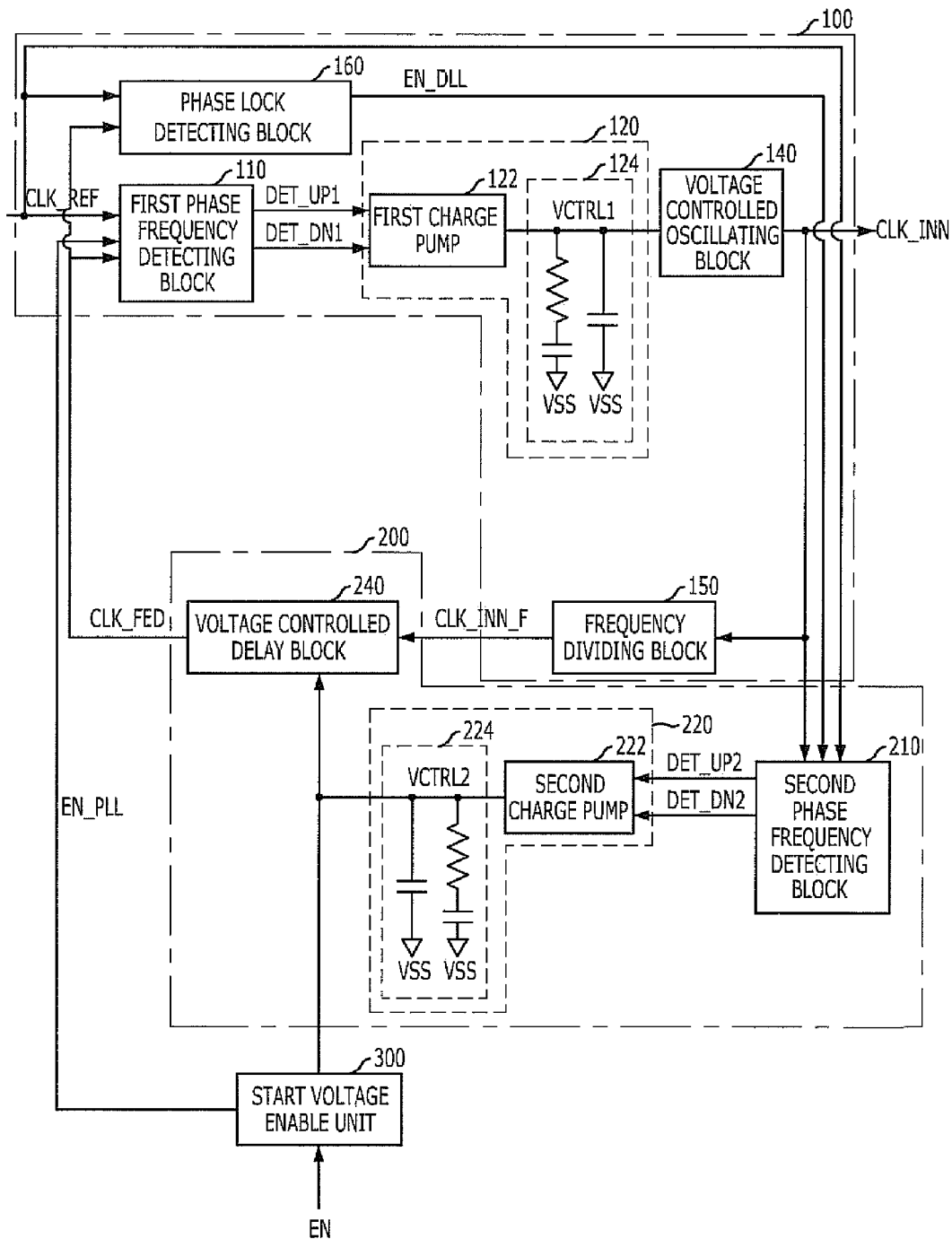
FIG. 1 is a block diagram illustrating a phase locked loop in accordance with an embodiment of the present invention.
Figure 2:
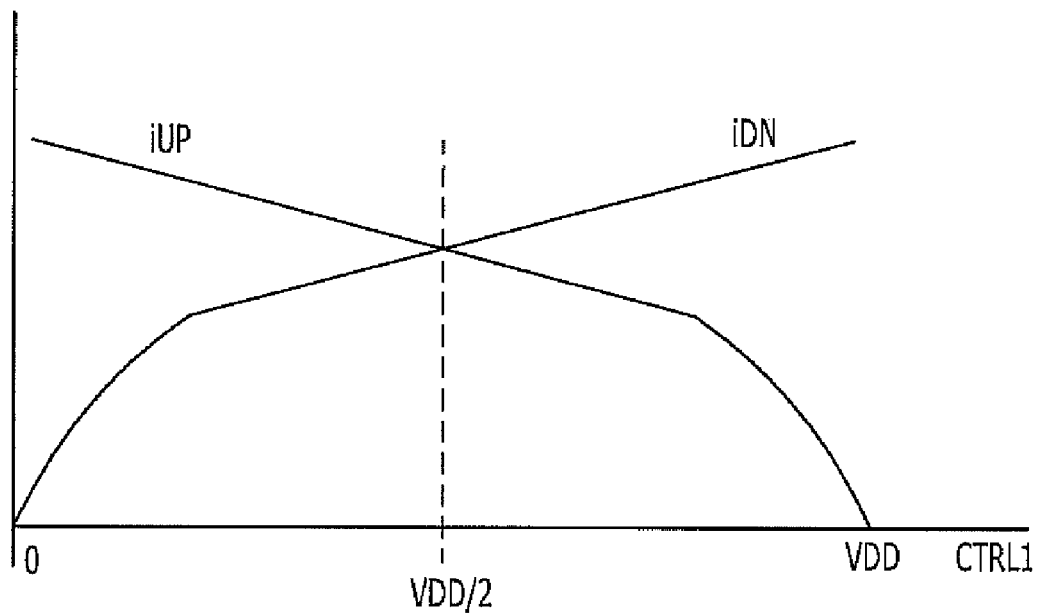
FIG. 2 is a graph show a voltage-current characteristic curve of a second charge pump in FIG. 1 in accordance with an embodiment of the present invention.

Exemplary embodiments of the present invention will be described below in more detail with reference to the accompanying drawings. The present invention may, however, be embodied in different forms and should not be constructed as limited to the embodiments set forth herein. Rather, these embodiments are provided so that this application will be thorough and complete, and will fully convey the scope of the present invention to those skilled in the art. Throughout the application, like reference numerals refer to like parts throughout the various figures and embodiments of the present invention.

FIG. 1 is a circuit diagram of a PLL in accordance with an embodiment of the present invention.

Referring to FIG. 1, the PLL in accordance with an embodiment of the present invention includes a phase lock unit 100, a delay lock unit 200 and a start voltage enable unit 300.

The phase lock unit 100 compares a phase of a reference clock CLK_REF with a phase of a feedback clock CLK_FED in response to a first enable signal EN_PLL outputted from the start voltage enable unit 300 and generates a certain internal clock CLK_INN based on a comparison result. The phase lock unit 100 includes a first phase frequency detecting block 110, a first control voltage generating block 120, a voltage controlled oscillating block 140, a frequency dividing block 150 and a phase lock detecting block 160.

The first phase frequency detecting block 110 receives the reference clock CLK_REF, the feedback clock CLK_RED and the first enable signal EN_PLL for enabling the phase lock unit 100.

The first phase frequency detecting block 110 compares a phase of the reference clock CLK_REF with a phase of the feedback clock CLK_FED, and generates a first up-detection signal DET_UP1 and a first down-detecting signal DET_DN1 according to a phase difference between the reference clock CLK_REF and the feedback clock CLK_FED.

The first control voltage generating block 120 generates a first control voltage VCTRL1 according to the first detection signal outputted from the first phase frequency detecting block 110, and includes a first charge pump 122 and a first loop filter 124.

The first charge pump 122 controls a current to be supplied to the loop filter 134 according to the pulse width of the first up-detection signal DET_UP1 and the first down-detection signal DET_DN1.

The loop filter 124 generates the first control voltage VCTRL1 by filtering the supplied current.

For example, the control voltage generating block 120 increases a voltage level of the first control voltage VCTRL1 in response to the first up-detection signal DET_UP1, and decreases a voltage level of the first control voltage VCTRL1 in response to the first down-detection signal DET_DN1.

The voltage controlled oscillating block 140 generates an internal clock CLK_INN having a frequency corresponding to a voltage level of the control voltage VCTRL1 outputted from the first control voltage generating block 120. For example, as the voltage level of the control voltage VCTRL1 becomes higher, the frequency of the internal clock CLK_INN becomes higher. As the voltage level of the control voltage VCTRL1 becomes lower, the frequency of the internal clock CLK_INN becomes lower.

The frequency dividing block 150 receives the internal clock CLK_INN and generates a divided feedback clock CLK_INN_F having a frequency lower than the internal clock CLK_INN.

The phase lock detecting block 160 receives the reference clock CLK_REF and the feedback clock CLK_FED and detects whether the phase locked unit 100 is locked or not. If the phase lock unit 100 is locked, the phase lock detecting block generates and provides a second enable signal EN_DLL for enabling the delay lock unit 200.

The delay lock unit 200 receives the reference clock CLK_REF, the second enable signal EN_DLL and the internal clock CLK_INN, and compares the phase of the reference clock CLK_REF with the phase of the internal clock CLK_INN outputted from the phase lock unit 100.

The delay lock unit 200 delays the divided internal clock CLK_INN by a certain delay amount and generates the feedback clock CLK_FED, which is synchronized with the reference clock CLK_REF.

The delay lock unit 200 includes a second phase frequency detecting block 210, a second control voltage generating block 220 and a voltage controlled delay block 240.

The second phase frequency detecting block 210 receives the second enable signal EN_DLL outputted from the phase lock detecting block 160, the internal clock CLK_INN and the reference clock CLK_REF.

The second phase frequency detecting block 210 compares the phase of the reference clock CLK_REF with the phase of the internal clock CLK_INN outputted from the voltage controlled oscillating block 140 in response to the second enable signal EN_DLL, and generates a second up-detection signal DET_UP2 and a second down-detection signal DET_DN2 corresponding to the phase difference between the reference clock CLK_REF and the internal clock CLK_INN.

The second control voltage generating block 220 generates a second control voltage VCTRL2 according to the second detection signal outputted from the second phase frequency detecting block 210, and includes a second charge pump 222 and a second loop filter 224.

The second charge pump 222 controls a current to be supplied to the second loop filter 224 according to the pulse width of the second up-detection signal DET_UP2 and the second down-detection signal DET_DN2.

The loop filter 224 generates the second control voltage VCTRL2 by filtering the supplied current.

For example, the second control voltage generating block 220 increases a voltage level of the second control voltage VCTRL2 in response to the second up-detection signal DET_UP2 and decreases a voltage level of the second control voltage VCTRL2 in response to the second down-detection signal DET_DN2.

The voltage controlled delay block 240 delays the divided internal clock CLK_INN_F outputted from the frequency dividing block 150 by a delay amount corresponding to the second control voltage, and generates and outputs the feedback clock CLK_FED to the phase lock unit 100.

Before the phase lock unit 100 and the delay lock unit 200 start their respective lock operations, the start voltage enable unit 300 applies a start voltage as the second control voltage VCTRL2 so that a mismatching of an up-current and a down-current is minimized in the second charge pump 224 of the delay lock unit 200 in response to the enable signal EN.

Figure 4:
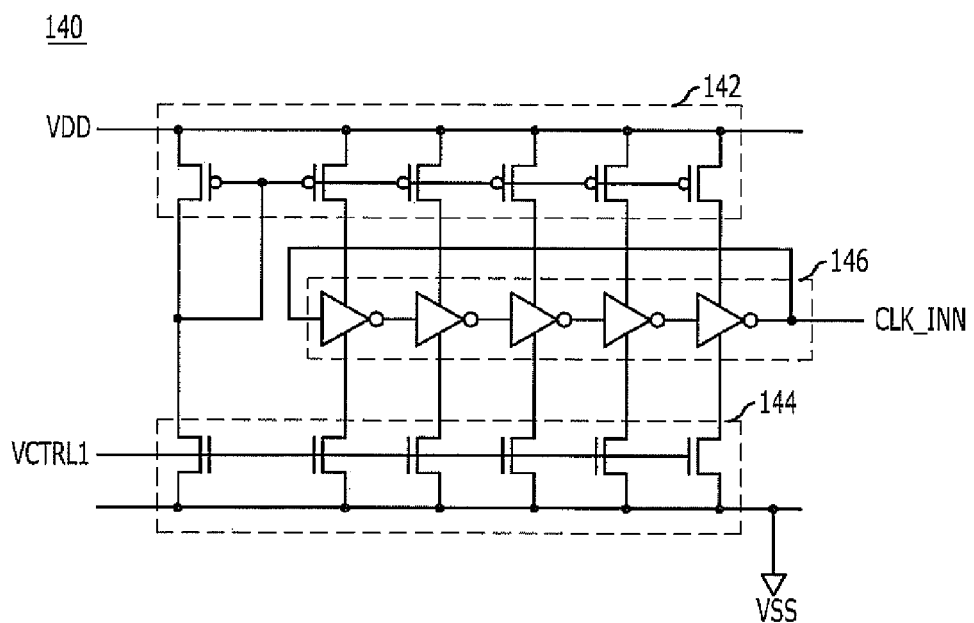
FIG. 4 is a circuit diagram illustrating a voltage controlled oscillating block shown in FIG. 1 in accordance with an embodiment of the present invention.

Referring to FIG. 4 which shows a graph illustrating a voltage-current characteristic curve of a charge pump in FIG. 1, where, when a half voltage level VDD/2 of a power supply voltage VDD is provided as a start voltage by the start voltage enable unit 300 of the second charge pump 222, mismatching of the up-current and the down-current is minimized/reduced. Thus, according to an example, a start voltage of the start voltage enable unit 300 may be the half voltage level (VDD/2) of the power supply voltage VDD.

When the enable signal EN is terminated, the start voltage enable unit 300 generates and provides the first enable signal EN_PLL to the first phase frequency detecting block 110 for enabling the phase lock unit 100.

Figure 3:
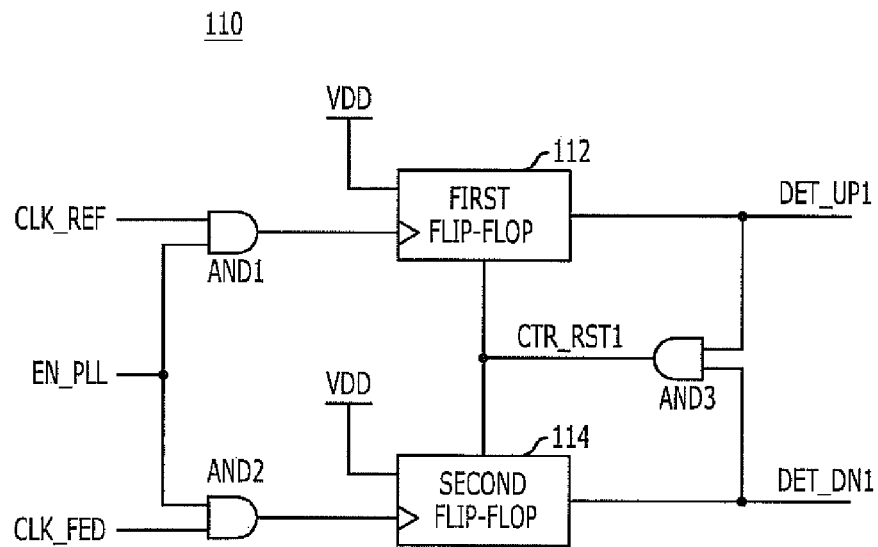
FIG. 3 is a circuit diagram illustrating a first phase frequency detecting block shown in FIG. 1 in accordance with an embodiment of the present invention.

FIG. 3 is a circuit diagram illustrating a first phase frequency detecting block shown in FIG. 1 in accordance with an embodiment of the present invention.

As shown in FIG. 3, the first phase frequency detecting block 110 includes a first logical product circuit AND1, a second logical product circuit AND2, a first D-flip-flop 112, a second D-flip-flop 114 and a first reset circuit AND3.

The first logical product circuit AND1 receives the first enable signal EN_PLL and the reference clock CLK_REF and performs a logical product operation. For example, if the first enable signal EN_PLL is inputted to the first logical product circuit AND1, the first logical product circuit AND1 outputs the reference clock CLK_REF in response to the first enable signal EN_PLL.

The second logical product circuit AND2 receives the first enable signal EN_PLL and the feedback clock CLK_FED and performs a logical product operation. For example, if the first enable signal EN_PLL is inputted to the second logical product circuit AND2, the second logical product circuit AND2 outputs the feedback clock CLK_FED in response to the first enable signal EN_PLL.

The first D-flip-flop 112 generates a first up-detection signal DET_UP1 in response to an operation result of the first logical product circuit AND1. The second D-flip-flop 114 generates a first down-detection signal DET_DN1 in response to an operation result of the second logical product circuit AND2.

The first reset circuit AND3 receives the first up-detection signal DET_UP1 and the first down-detection signal DET_DN1, and generates a first reset signal CTR_RST1 for resetting the first and second D-flip-flops 112 and 114.

For example, when the reference clock CLK_REF is a logic 'high' level, the first reset circuit AND3 enables the first up-detection signal DET_UP1 to have a logic 'high' level, and when the feedback clock CLK_FED is a logic 'high' level, the first reset circuit AND3 enables the first down-detection signal DET_DN1 to have a logic 'high' level.

When both of the reference clock CLK_REF and feedback clock CLK_FED are at logic 'high' level, the first reset circuit AND3 activates the first reset signal CTR_RST1 and resets the first and second D-flip-flops 112 and 114.

Because a detailed circuit configuration of the first and second D-flip-flops 112 and 114 is apparent to a person of ordinary skill in the art, a detailed description thereof is omitted. In another embodiment of the present invention, a first phase frequency detecting block may be implemented in different configuration.

FIG. 4 is a circuit diagram illustrating a voltage controlled oscillating block shown in FIG. 1 in accordance with an embodiment of the present invention.

As shown in FIG. 4, the voltage controlled oscillating block 140 includes a plurality of PMOS transistors 142, a plurality of NMOS transistors 144 and a plurality of inverters 146.

Each of the inverters 146 has a delay amount that depends on a voltage level of the first control voltage VCTRL1.

If a voltage level of the first control voltage VCTRL1 is high, the delay amount of each inverter is small, and the voltage controlled oscillating block 140 generates the internal clock CLK_INN of a high frequency.

If a voltage level of the first control voltage VCTRL1 is low, the delay amount of each inverter is large, and the voltage controlled oscillating block 140 generates the internal clock CLK_INN of a low frequency.

In another embodiment of the present invention, the voltage controlled oscillating block may be implemented in a different manner.

Figure 5:
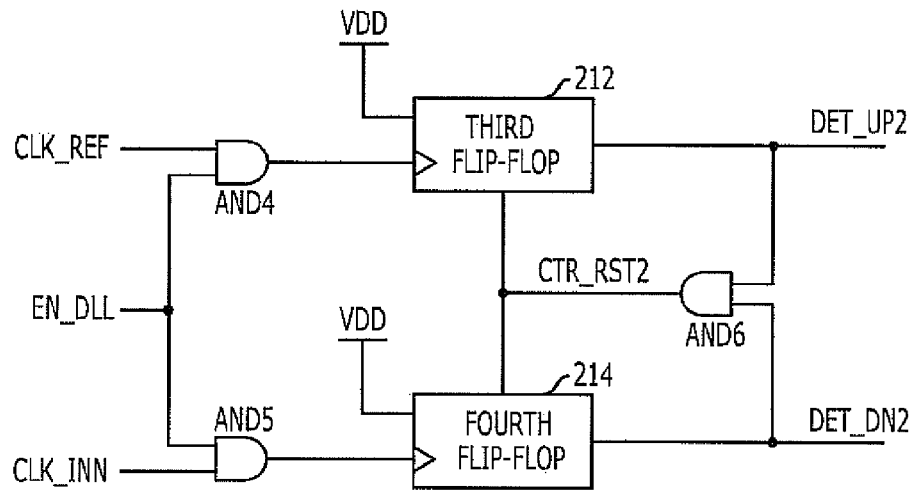
FIG. 5 is a circuit diagram illustrating a second phase frequency detecting block shown in FIG. 1 in accordance with an embodiment of the present invention.

FIG. 5 is a circuit diagram illustrating a second phase frequency detecting block shown in FIG. 1 in accordance with an embodiment of the present invention.

As shown in FIG. 5, the second phase frequency detecting block 210 includes a third logical product circuit AND4, a fourth logical product circuit AND5, a third D-flip-flop 212, a fourth D-flip-flop 214 and a second reset circuit AND6.

The third logical product circuit AND4 receives the reference clock CLK_REF and the second enable signal EN_DLL outputted from the phase lock detecting block 160, and performs a logical product operation. For example, if the second enable signal EN_DLL is inputted to the third logical product circuit AND4, the third logical product circuit AND4 outputs the reference clock CLK_REF in response to the second enable signal EN_DLL.

The fourth logical product circuit AND5 receives the internal clock CLK_INN and the second enable signal EN_DLL outputted from the phase lock detecting block 160, and performs a logical product operation. For example, if the second enable signal EN_DLL is inputted to the fourth logical product circuit AND5, the fourth logical product circuit AND5 outputs the internal clock CLK_INN in response to the second enable signal EN_DLL.

The third D-flip-flop 212 generates a second up-detection signal DET_UP2 in response to an operation result of the third logical product circuit AND4. The fourth D-flip-flop 214 generates a second down-detection signal DET_DN2 in response to an operation result of the fourth logical product circuit AND5.

The second reset circuit AND6 receives the second up-detection signal DET_UP2 and the second down-detection signal DET_DN2, and generates a second reset signal CTR_RST2 for resetting the third and fourth D-flip-flops 212 and 214.

For example, when the reference clock CLK_REF is at a logic 'high' level, the second reset circuit AND6 enables the second up-detection signal DET_UP2 to have a logic 'high' level, and when the internal clock CLK_INN is a logic 'high' level, the second reset circuit AND6 enables the second down-detection signal DET_DN2 to have a logic 'high' level.

When both of the reference clock CLK_REF and internal clock CLK_INN are at logic 'high' level, the second reset circuit AND6 activates the second reset signal CTR_RST2 and resets the third and fourth D-flip-flops 212 and 214.

Because a detailed circuit configuration of the third and fourth D-flip-flops 212 and 214 is apparent to a person or ordinary skill in the art, a detailed description thereof is omitted. In another embodiment of the present invention, a second phase frequency detecting block may be implemented in a different configuration as appropriate.

Figure 6:
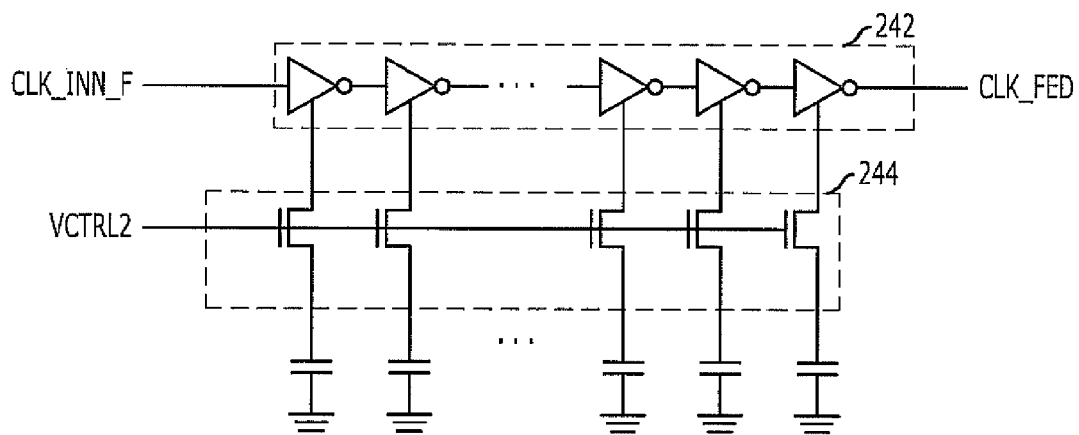
FIG. 6 is a circuit diagram illustrating a voltage controlled delay block shown in FIG. 1 in accordance with an embodiment of the present invention.

FIG. 6 is a circuit diagram illustrating a voltage controlled delay block in FIG. 1 in accordance with an embodiment of the present invention.

As shown in FIG. 6, the voltage controlled delay block 240 includes a plurality of inverters 242 and a plurality of transistors 244.

The plurality of transistors 244 adjusts a delay amount of the divided internal clock CLK_INN_F outputted from the frequency dividing block 150 according to the second control voltage VCTRL2 outputted from the second control voltage generating block 220.

In another embodiment of the present invention, a voltage controlled delay block may be implemented in a different configuration as appropriate.

Moreover, in another embodiment of the present invention, a frequency dividing block 150 may be omitted, and the internal clock CLK_INN outputted from the voltage controlled oscillating block 140 may be directly provided to the voltage controlled delay block 240.

Because a detailed circuit configuration of the first control voltage generating block 120, the phase lock detecting block 160, the second control voltage generating block 220 and the start voltage enable unit 300 is apparent to a person of ordinary skill in the art, a detailed description thereof is omitted.

Hereinafter, an operation of the PLL shown in FIG. 1 in accordance with an embodiment of the present invention will be described in detail.

Before the phase lock unit 110 and the delay lock unit 200 start the lock operations, if the enable signal EN is provided to the start voltage enable unit 300, the start voltage enable unit 300 provides the start voltage as the second control voltage VCTRL2 in response to the enable signal EN so that the second control voltage generating block 220 starts under an optimized condition.

When the enable signal EN is terminated, the start voltage enable unit 300 generates and provides the first enable signal EN_PLL to the first phase frequency detecting block 110 of the phase lock unit 100.

If the first enable signal EN_PLL is inputted to the first phase frequency detecting block 110 of the phase lock unit 100, the phase lock unit 100 compares the phase of the reference clock CLK_REF and the phase of the feedback clock CLK_FED in response to the first enable signal EN_PLL, and generates the first control voltage VCTRL1 based on the phase difference between the reference clock CLK_REF and the feedback clock CLK_FED. The phase lock unit 100 generates an internal clock CLK_INN having a frequency corresponding to the first control voltage VCTRL1, and performs a locking operation so that the reference clock CLK_REF is synchronized with the feedback clock.

The phase lock detecting block 160 of the phase lock unit 100 detects the locking of the phase lock unit 100. If the locking operation of the phase lock unit 100 is completed, the phase lock detecting block 160 generates and provides the second enable signal EN_DLL to the delay lock unit 200.

If the second enable signal EN_DLL is provided to the delay lock unit 200, the delay lock unit 200 compares the phase of the reference clock CLK_REF and the internal clock CLK_INN outputted from the phase lock unit 100 in response to the second enable signal EN_DLL, and changes the second control voltage VCTRL2 (which starts at the start voltage VDD/2) based on the phase difference between the reference clock CLK_REF and the internal clock CLK_INN.

The delay amount of the voltage controlled delay block 240 is changed according to the change of the second control voltage VCTRL2, and the feedback clock CLK_FED outputted from the voltage controlled delay block 240 is finally synchronized with the reference clock CLK_REF and the internal clock CLK_INN.

Accordingly, because the second control voltage VCTRL2 having the start voltage is changed by a small amount at a half voltage level VDD/2 of the power supply voltage VDD, a current driving capacity of the second control voltage generating block is matched optimally, and the phase offset of the reference clock CLK_REF and the feedback clock CLK_FED is minimized through the operation of the PLL in accordance with an embodiment of the present invention.

The PLL in accordance with an embodiment of the present invention removes a phase offset between a reference clock and a feedback clock, and minimizes/reduces a mismatching between an up-current and a down-current.

While the present invention has been described with respect to the specific embodiments, it will be apparent to those skilled in the art that various changes and modifications may be made without departing from the spirit and scope of the invention as defined in the following claims.

What is claimed is:

1. A phase locked loop, comprising:
   a phase lock unit configured to compare a phase of a reference clock with a phase of a feedback clock and to generate an internal clock based on the comparison;
   a delay lock unit configured to compare the reference clock with the internal clock, and to generate the feedback clock which is delayed in response to a control voltage based on the comparison of the reference clock with the internal clock; and
   a start voltage enable unit configured to receive an enable signal and to apply a start voltage as the control voltage in response to the enable signal.

2. The phase locked loop of claim 1, wherein the start voltage of the start voltage enable unit is a half of a power supply voltage.

3. The phase locked loop of claim 1, wherein if the enable signal is terminated, the start voltage enable unit is configured to generate a first enable signal for enabling the phase lock unit and to provide the first enable signal to the phase lock unit.

4. The phase locked loop of claim 3, wherein the phase lock unit comprises:
   a first phase frequency detecting block configured to receive the reference clock, the feedback clock and the first enable signal, to compare the phase of the reference clock with the phase of the feedback clock in response to the first enable signal, and to generate a first detection signal corresponding to a phase difference between the reference clock and the feedback clock;
   a first control voltage generating block configured to generate a first control voltage in response to the first detection signal; and
   a voltage controlled oscillating block configured to generate the internal clock having a frequency corresponding to a voltage level of the first control.

5. The phase locked loop of claim 4, wherein the phase lock unit further comprises a frequency dividing block configured to generate a divided internal clock having a frequency lower than a frequency of the internal clock by dividing the frequency of the internal clock.

6. The phase locked loop of claim 4, wherein the phase lock unit further comprises a phase lock detecting block configured to detect a phase lock of the phase lock unit by comparing the phase of the reference clock with the phase of the feedback signal, and to generate and provide a second enable signal for enabling the delay lock unit to the delay lock unit if the phase lock is detected.

7. The phase locked loop of claim 6, wherein the delay lock unit comprises:
   a second phase frequency detecting block configured to receive the second enable signal, the internal clock and the reference clock, to compare a phase of the reference clock with a phase of the internal clock in response to the second enable signal, and to generate a second detection signal corresponding to a phase difference between the reference clock and the internal clock;
   a second control voltage generating block configured to generate a second control voltage in response to the second detection signal outputted from the second phase frequency detecting block, wherein the second control voltage is the control voltage of the delay lock unit; and a voltage controlled delay block configured to delay the internal clock by a delay amount corresponding to the second control voltage and to generate and output the feedback clock to the phase lock unit.

8. A phase locked loop, comprising:

a phase lock unit configured to receive a reference clock and a feedback clock, compare a phase of the reference clock and a phase of the feedback clock and generate an internal clock based on a comparison result; and a delay lock unit configured to receive the internal clock and the reference clock, compare a phase of the internal clock outputted from the phase lock unit with the phase of the reference clock and generate the feedback clock by delaying the internal clock by a certain delay amount, wherein the feedback clock is synchronized with the reference clock.

9. The phase locked loop of claim 8, wherein the phase lock unit comprises:

a first phase frequency detecting block configured to compare the phase of the reference clock with the phase of the feedback clock, and to generate a first detection signal corresponding to a phase difference between the reference clock and the feedback clock;

a first control voltage generating block configured to generate a first control voltage in response to the first detection signal outputted from the first phase frequency detecting block; and a voltage controlled oscillating block configured to generate the internal clock having a frequency corresponding to a voltage level of the first control voltage outputted from the first control voltage generating block.

10. The phase locked loop of claim 9, wherein the phase lock unit further comprises a frequency dividing block configured to generate a divided internal clock by dividing the frequency of the internal clock.

11. The phase locked loop of claim 9, wherein the phase lock unit further comprises a phase lock detecting block configured to detect a phase lock of the phase lock unit by comparing the phase of the reference clock with the phase of the feedback signal, and to generate and provide a second enable signal for enabling the delay lock unit to the delay lock unit if the phase lock is detected.

12. The phase locked loop of claim 11, wherein the delay lock unit comprises:

a second phase frequency detecting block configured to receive the second enable signal, internal clock and reference clock, to compare a phase of the reference clock with a phase of the internal clock in response to the second enable signal, and to generate a second detection signal corresponding to a phase difference between the reference clock and the internal clock;

a second control voltage generating block configured to generate a second control voltage in response to the second detection signal outputted from the second phase frequency detecting block; and a voltage controlled delay block configured to delay the internal clock by a delay amount corresponding to the second control voltage and to generate and output the feedback clock to the phase lock unit.

13. A method for operating a phase locked loop (PLL), comprising:

applying a start voltage to a delay lock unit if an enable signal is received;

providing a first enable signal for enabling a phase lock unit to the phase lock unit if the enable signal is terminated;

comparing a phase of a reference clock with a phase of a feedback clock and generating an internal clock based on the comparison; and comparing the phase of the reference clock with the phase of the internal clock and generating the feedback clock based on the comparison of the phase of the reference clock with the phase of the internal clock.

14. The method for operating the PLL of claim 13, further comprising:

detecting whether a locking operation of the phase lock unit is completed or not by comparing a phase of the reference clock with a phase of the feedback clock; and generating and providing a second enable signal for enabling the delay lock unit to the delay lock unit if the locking operation is completed.

15. The method for operating the PLL of claim 14, wherein the generating of the feedback clock comprises:

comparing the phase of the internal clock with the phase of the reference clock in response to the second enable signal;

changing a second control voltage based on a phase difference between the internal clock and the reference clock; and synchronizing the feedback clock with reference clock by changing a delay amount of the delay lock unit according to a change of the second control voltage.

16. A method for operating a phase locked loop (PLL), comprising:

performing a first locking operation by comparing a phase of a reference clock and a phase of a feedback clock and generating an internal clock, which is synchronized with the reference clock, based on a comparison result; and performing a second locking operation by comparing the phase of the reference clock and a phase of the internal clock and generating the feedback clock by delaying the internal clock by a certain delay amount, wherein the phase of the internal clock is generated by performing the first locking operation and the feedback clock is synchronized with the reference clock.

17. The method for operating the PLL of claim 16, further comprising:

detecting whether the first locking operation is completed or not; and generating a second enable signal for enabling a delay lock unit if the first locking operation is completed.

18. The method for operating the PLL of claim 17, wherein the performing of the second locking operation comprises:

comparing the phase of the reference clock and the phase of the internal clock in response to the second enable signal;

changing a second control voltage based on a phase difference between the reference clock and the internal clock; and synchronizing the reference clock with the feedback clock by changing the certain delay amount of the internal clock according to a change of the second control voltage.

* * * * *